(12) United States Patent
Choi et al.

(10) Patent No.: US 8,187,778 B2
(45) Date of Patent: May 29, 2012

(54) METHOD FOR CORRECTING A POSITION ERROR OF LITHOGRAPHY APPARATUS

(75) Inventors: Jin Choi, Seoul (KR); Dong-Seok Nam, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 12/656,817

(22) Filed: Feb. 17, 2010

(65) Prior Publication Data

US 2010/0209831 A1   Aug. 19, 2010

(30) Foreign Application Priority Data

Feb. 18, 2009   (KR) .................. 10-2009-0013433

(51) Int. Cl.
*G03F 9/00*   (2006.01)
(52) U.S. Cl. ............ 430/22; 430/30; 430/945; 356/399; 356/400
(58) Field of Classification Search .............. 430/22, 430/30, 945; 356/399, 400
See application file for complete search history.

(56) References Cited

U.S. PATENT DOCUMENTS

| 6,686,107 | B2 | 2/2004 | Matsumoto et al. |
| 7,019,815 | B2 | 3/2006 | Jasper et al. |
| 7,106,444 | B2 * | 9/2006 | Nakajima ................ 356/401 |

FOREIGN PATENT DOCUMENTS

| JP | 04-357819 A | 12/1992 |
| JP | 2002-196476 A | 7/2002 |
| JP | 2006-047669 A | 2/2006 |

* cited by examiner

*Primary Examiner* — Christopher Young
(74) *Attorney, Agent, or Firm* — Lee & Morse, P.C.

(57) ABSTRACT

A method for correcting a position error of a lithography apparatus comprises inputting position data of exposure pattern, irradiating laser light onto a position reference mask from a position measurement laser system, calculating actual position data of the laser light irradiated onto the position reference mask, and comparing the position data of the exposure pattern with the actual position data of the laser light irradiated onto the position reference mask. With this method, circuit patterns can be accurately formed at predetermined positions on a photomask, and the circuit patterns on the photomask can be accurately formed at predetermined positions on a wafer.

15 Claims, 8 Drawing Sheets

METHOD FOR CORRECTING A POSITION ERROR OF LITHOGRAPHY APPARATUS

BACKGROUND

1. Field

Exemplary embodiments relate to a method for correcting a position error of a lithography apparatus, and more specifically, to a method for calculating a position error correction amount of a position reference mask to correct a position error of a lithography apparatus.

2. Description of the Related Art

In general, a photomask to be patterned is exposed to electron beams irradiated from an electron-beam lithography apparatus. For example, a layer made of chrome or the like through which light is not transmitted is formed on a transparent glass substrate. A resist layer reacting to electron beams or light may be formed on the layer made of chrome or the like. Then, electron beams are irradiated to expose a shape which is to be patterned. The resist layer is developed to form resist patterns. The chrome layer is etched. The resist patterns are removed to complete the photomask.

In this case, a process of irradiating the electron beams onto the resist layer may be the most important process.

However, the electron-beam lithography apparatus for manufacturing a photomask as described above may have a position error due to the limit of accuracy in positioning a stage, mask sliding, and so on. Such a position error tends to change according to time. Therefore, the position error of the lithography apparatus needs to be corrected periodically.

SUMMARY

Embodiments are therefore directed to a method for calculating a position error correction amount of a position reference mask to correct a position error of a lithography apparatus, which substantially overcomes one or more of the problems due to the limitations and disadvantages of the related art.

It is therefore a feature of an embodiment to provide a method for correcting a position error of a lithography apparatus, comprising: inputting position data of exposure pattern; irradiating laser light onto a position reference mask from a position measurement laser system; calculating actual position data of the laser light irradiated onto the position reference mask; and comparing the position data of the exposure pattern with the actual position data of the laser light irradiated onto the position reference mask.

The method may further comprise calculating a position error correction amount of the position reference mask based on a result of the comparison when it is judged that a difference between the position data of the exposure pattern and the actual position data of the laser light is larger than a reference value.

The calculated position error correction amount may be equal to or less than the difference.

The method may further comprise moving a wafer stage on which a wafer is disposed according to the calculated position error correction amount.

The method may further comprise irradiating laser light onto the wafer from a light source after moving the wafer stage.

The position reference mask may be disposed on the wafer stage on which the wafer is disposed.

Irradiating the laser light onto the position reference mask may be periodically performed while a resist disposed on the wafer is exposed. The position data of the exposure pattern and the actual position data of the laser light irradiated onto the position reference mask may be compared and the position error correction amount of the position reference mask is calculated. A position error of the wafer stage may be corrected in real time according to the calculated position error correction amount.

The method may further comprise moving a mask stage on which a photomask is disposed according to the calculated position error correction amount.

The method may further comprise irradiating electron beams onto the photomask after moving the mask stage.

The position reference mask may be disposed on the mask stage on which the photomask is disposed.

Irradiating the laser light onto the position reference mask may be periodically performed while a resist disposed on the photomask is exposed. The position data of the exposure pattern and the actual position data of the laser light irradiated onto the position reference mask may be compared and the position error correction amount of the position reference mask is calculated. A position error of the mask stage may be corrected in real time according to the calculated position error correction amount.

The method may further comprise irradiating laser light onto a wafer from a light source when it is judged that a difference between the position data of the exposure pattern and the actual position data is smaller than a reference value.

The method may further comprise irradiating electron beams onto a photomask, when it is judged that a difference between the position data of the exposure pattern and the actual position data is smaller than a reference value.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
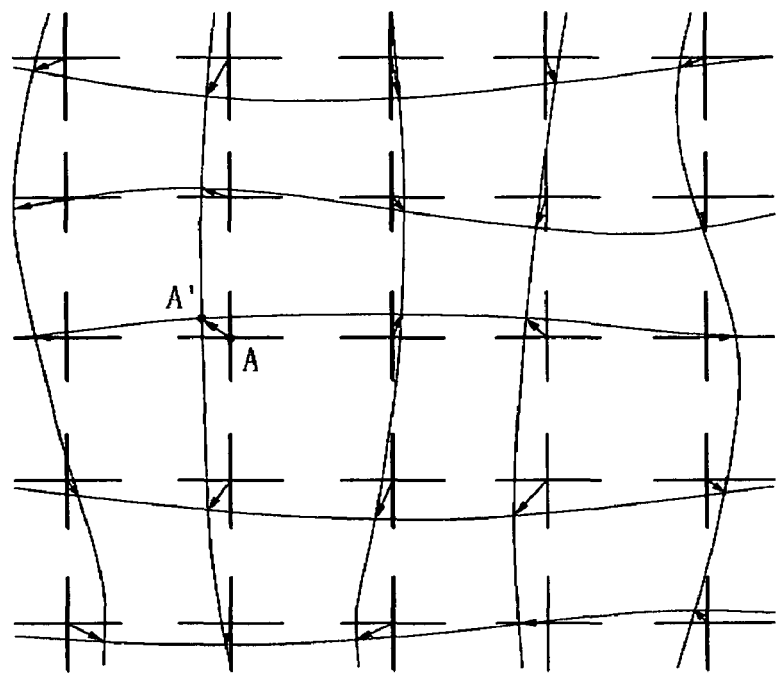
FIG. 1 illustrates a diagram of a grid map for explaining a position error of an electron-beam lithography apparatus.

Korean Patent Application No. 10-2009-0013433, filed on Feb. 18, 2009, in the Korean Intellectual Property Office, and entitled: "Method for Correcting a Position Error of Lithography Apparatus," is incorporated by reference herein in its entirety.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Various exemplary embodiments will now be described more fully with reference to the accompanying drawings in which some exemplary embodiments are shown. In the drawings, the thicknesses of layers and regions may be exaggerated for clarity.

Accordingly, while exemplary embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, exemplary embodiments are to cover all modifications, equivalents, and alternatives falling within the scope of the invention. Like numbers refer to like elements throughout the description of the figures.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Exemplary embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe exemplary embodiments, various aspects will be described in detail with reference to the attached drawings. However, the invention is not limited to exemplary embodiments described.

FIG. 1 illustrates a diagram of a grid map for explaining a position error of an electron-beam lithography apparatus.

Referring to FIG. 1, an electron-beam lithography apparatus may have a position error as shown in FIG. 1 due to the limit of accuracy in positioning a stage, mask sliding, and so on.

That is, in the electron-beam lithography apparatus for manufacturing a photomask, an electron-beam irradiation system may irradiate electron beams to a predetermined position, while a stage having a photomask seated thereon moves in four directions. The electron beams are irradiated onto the surface of the photomask to form patterns. However, a position error of the lithography apparatus may be caused by the limit of accuracy in positioning the stage, mask sliding, and so on. Therefore, as illustrated in FIG. 1, electron beams to be irradiated onto a position A on the photomask may be irradiated on to a position A'.

Figure 2:
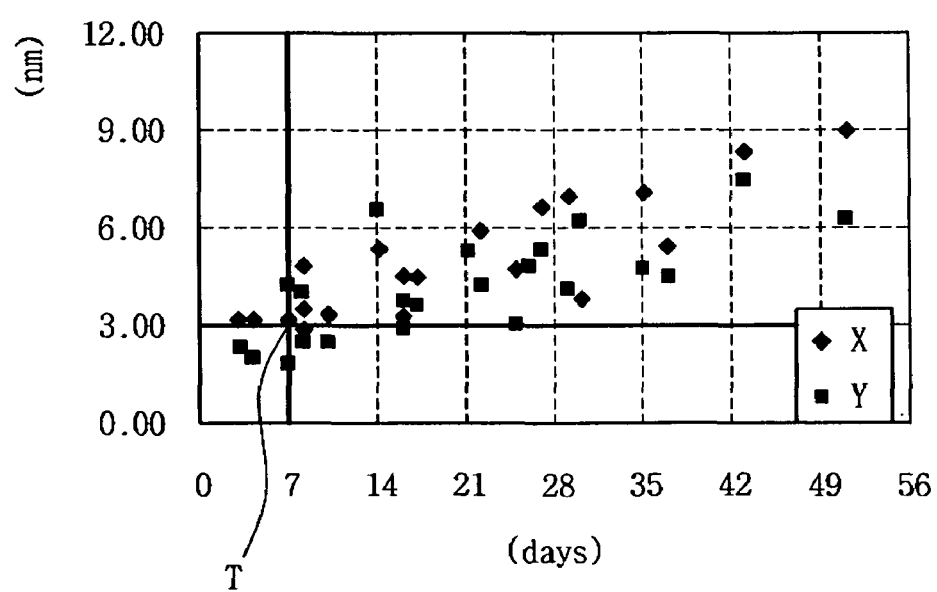
FIG. 2 illustrates a graph presenting changes in a position error of an electron-beam lithography apparatus according to time.

FIG. 2 illustrates a graph presenting changes in a position error of an electron-beam lithography apparatus according to time.

Referring to FIG. 2, a position to which an electron beam is to be irradiated is set to T, and a grid position of the actually-irradiated electron beam is represented by X or Y. As shown in FIG. 2, the grid position X and Y of the actually-irradiated electron beam changes from the position T according to time.

The above-described position error may be corrected in real time by an electron-beam lithography apparatus as described below.

Figure 3:
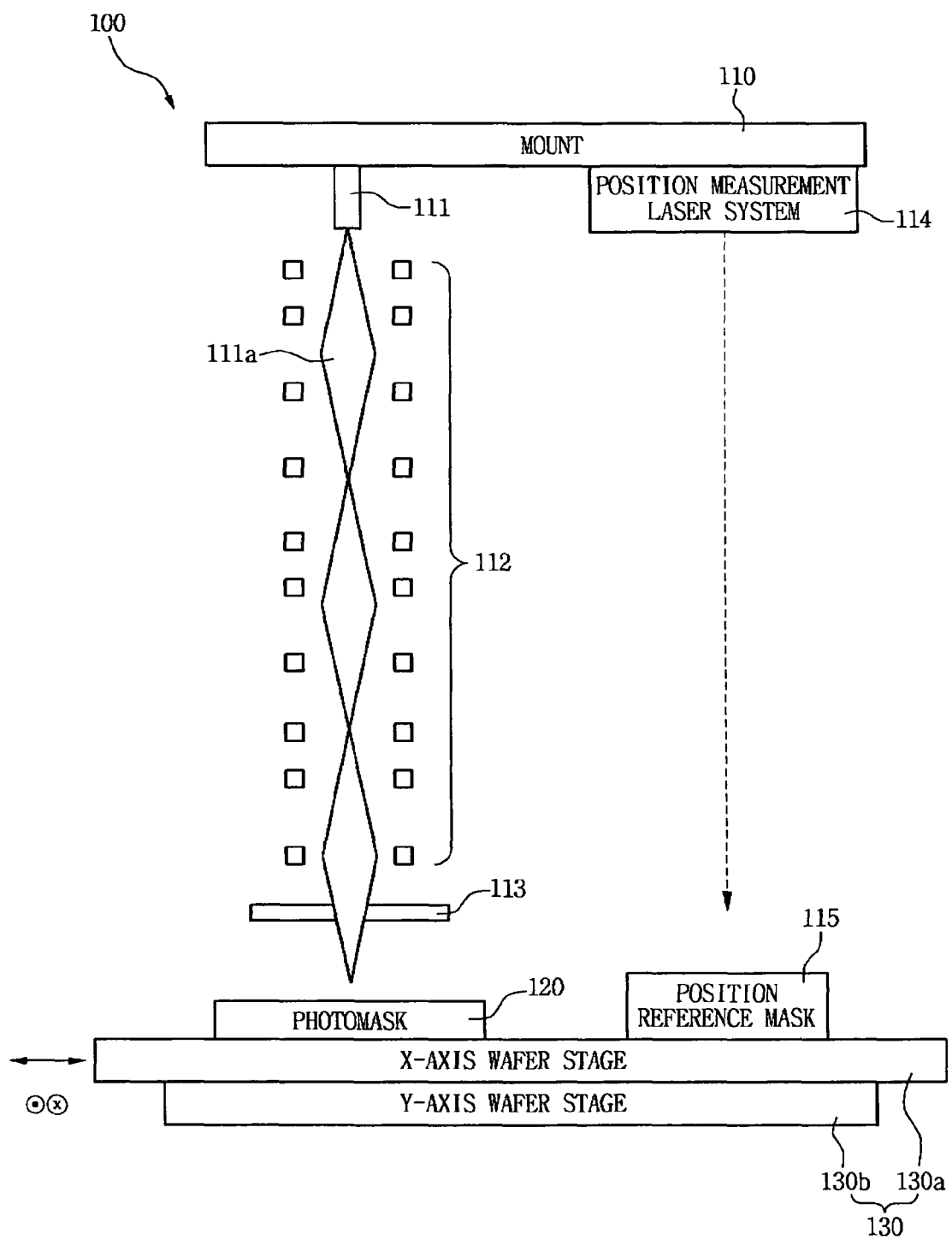
FIG. 3 illustrates a schematic view of an electron-beam lithography apparatus according to an exemplary embodiment.

FIG. 3 illustrates a schematic view of an electron-beam lithography apparatus according to an exemplary embodiment.

Referring to FIG. 3, an electron beam lithography apparatus 100 may include an electron gun 111 configured to emit electron beams 111a, an electronic lens unit 112 configured to guide the emitted electron beams in one direction, and an aperture 113 configured to adjust the size of the electron beams.

The electron gun 111 may receive electric energy to emit electrons through heat emission or field emission. Further, the electron lens unit 112 may provide a magnetic field so as to guide electron beams emitted from the electron gun 111 in one direction.

The electronic lens unit may include a shaping deflector configured to shape electron beams into a predetermined shape, a shaping lens, and an object lens configured to condense the electron beams, depending on a design of the electronic lens unit. The configuration of the electronic lens unit is not limited to this embodiment.

The aperture 113 may serve to adjust the size of electron beams. The aperture 113 may be formed in a variable rectangular shape. In this case, blinds of the aperture may adjust the size of an opening through which electron beams may pass, in order to adjust the size of the electron beams. Further, the aperture 113 may be formed in a circular shape. In this case, blinds of the aperture may rotate to adjust the size of an opening through which electron beams may pass in order to adjust the size of the electron beams. The shape of the aperture is not limited to the above-described shapes.

A mask stage 130 may be disposed having a predetermined distance from the aperture. A photomask 120 may be disposed on the mask stage 130.

In this case, the mask stage 130 may comprise an X-axis mask stage 130a and a Y-axis mask stage 130b. The X-axis mask stage 130a may move the photomask along the X-axis. The Y-axis stage 130b may move the photomask along the Y-axis.

Further, a resist may be applied onto the photomask 120. The photomask may be formed through the resist as follows.

Figure 6A:
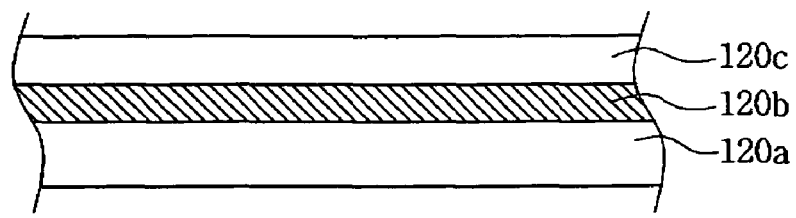
FIGS. 6A to 6C illustrate schematic cross-sectional views for explaining a process of forming a photomask.
Figure 6B:
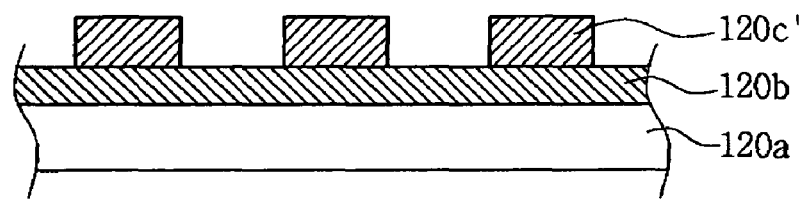
Figure 6C:
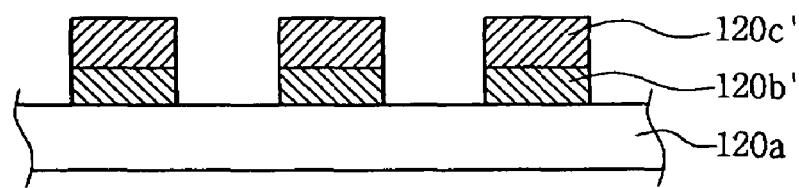

FIGS. 6A to 6C illustrate schematic cross-sectional views for explaining a process of forming a photomask.

Referring to FIG. 6A, the photomask may include a light shielding layer 120b formed on a substrate 120a and a resist layer 120c formed on the light shielding layer 120b. The substrate 120a may be a glass substrate made of quartz.

The light shielding layer 120b may be a chrome layer for shielding light. The light shielding layer 120b may be made of material that has an excellent adhesive force with the glass substrate 120a and a similar thermal expansion coefficient to that of the glass substrate 120a, and can reflect light. That is, metallic materials may be used as material for the light shielding layer 120b. In addition to chrome, metals including aluminum, titanium, molybdenum, ruthenium, tantalum, and so on, metal alloys, or a metal compound combined with oxygen or nitrogen may be used as material for the light shielding layer 120b. For example, a chrome-aluminum alloy, chrome oxide, chrome nitride, aluminum oxide, aluminum nitride, oxides and nitrides of other metals, or compounds such as oxynitrides of all metals may be used as material for the light shielding layer 120b.

Although not illustrated in FIGS. 6A to 6C, an anti-reflection layer may be formed on the light shielding layer 120a. Any layer which reflects a small amount of light than the light shielding layer 120a may be designated as the anti-reflection layer. The anti-reflection layer may be formed as an independent material layer. However, the anti-reflection layer may be formed of a material layer which can be patterned at the same time as the light shielding layer 120a, considering easiness of pattern formation. For example, when the light shielding layer 120a is formed of a chrome layer, a chrome oxide layer may be formed as the anti-reflection layer. Even when the light shielding layer 120a is not a pure chrome layer but made of a metal alloy or metal compound containing chrome, the chrome oxide layer may be used as the anti-reflection layer.

The resist layer 120c may be made of material which can be selectively patterned by a developing solution after being exposed to electron beams. Specifically, the resist layer 120c may be made of a highly polymerized compound based on carbon. The resist layer 120c may be an electron beam resist layer.

The resist layer 120c may be exposed to the electron beams irradiated onto the above-described photomask, and then developed by a developing solution to form resist patterns 120c' as illustrated in FIG. 6B. Specifically, to form the resist patterns 120c', the developing solution may be jetted or poured onto the surface of the resist layer 120c. Alternatively, the photomask may be dipped in the developing solution. When the resist patterns 120c' are formed, the light shielding layer 120b under the resist patterns 120c' may be selectively exposed. Since developing methods are well-known techniques, the detailed descriptions of the development methods are omitted here.

Referring to FIG. 6C, the exposed light shielding layer 120b may be etched using the resist patterns 120c' as an etching mask in order to form light shielding patterns 120b' through which the substrate 120a is selectively exposed. Specifically, the exposed light shielding layer 120b may be etched with a wet or dry etching method to form the light shielding patterns 120b' through which the substrate 120a is selectively exposed. In the wet etching method, the photomask may be dipped in an acid etching solution, or the etching solution may be jetted onto the surface of the light shielding layer 120b. The acid etching solution may include $H_2SO_4$, HF, $H_3PO_4$, or HCl. In the dry etching method, a combination of etching gases including halogen group gases (F, Cl, Br, and so on) may be used. The gases including halogen group gases may be $CF_4$, $CHF_3$, $C_2F_4$, $C_3F_4$, $C_3F_6$, $C_4F_8$, $SF_6$, or $CCl_4$. The combination of etching gases may include the gases including halogen group gases and inert gases such as Ne, Ar, and Xe. Further, the combination of etching gases may include one or more of $O_2$ and $N_2$. Since etching methods are well-known techniques, the detailed descriptions of the etching methods are omitted here.

After that, the resist patterns 120c' may be removed to selectively expose the light shielding patterns 120b' and the substrate 120a. Consequently, a photomask having final circuit patterns may be formed. At this time, the resist patterns 120c' may be removed with a wet method using a stripper containing $H_2SO_4$ or a dry method using a combination of gases containing $O_2$.

Returning to FIG. 3, the electron beam lithography apparatus according to an exemplary embodiment will be described.

The lithography apparatus may further include a position measurement laser system 114 and a position reference mask 115. The position measurement laser system 114 and the electron gun 111 may be installed on a mount 110. The position reference mask 115 may be disposed at a position having a predetermined distance from the position measurement laser system 114. In this case, the position reference mask 115 may be disposed on the mask stage on which the photomask is disposed.

The position measurement laser system 114 may irradiate laser light onto a position reference mask 115 to calculate the position of the irradiated laser light. The position reference mask 115 may have a reference grid formed thereon. The actual position of the laser light irradiated from the position measurement laser system 114 may be compared with a position of the reference grid.

As described above, the position reference mask 115 may be disposed on the mask stage on which the photomask is disposed. Therefore, when the photomask moves, the position reference mask 115 may move for the same distance as the photomask 120.

That is, the position reference mask 115 and the photomask 120 simultaneously move for the same distance. Therefore, the position of the photomask 120 may be calculated by calculating the position of the position reference mask 115.

Further, when a position error occurs on the position reference mask 115, the same position error may occur on the photomask 120. Therefore, it may be possible to calculate the position error of the photomask 120. In particular, since the position of the position reference mask 115 may be periodically calculated even while the photomask 120 is exposed, the position error of the photomask 120 may be calculated in real time.

Figure 4A:
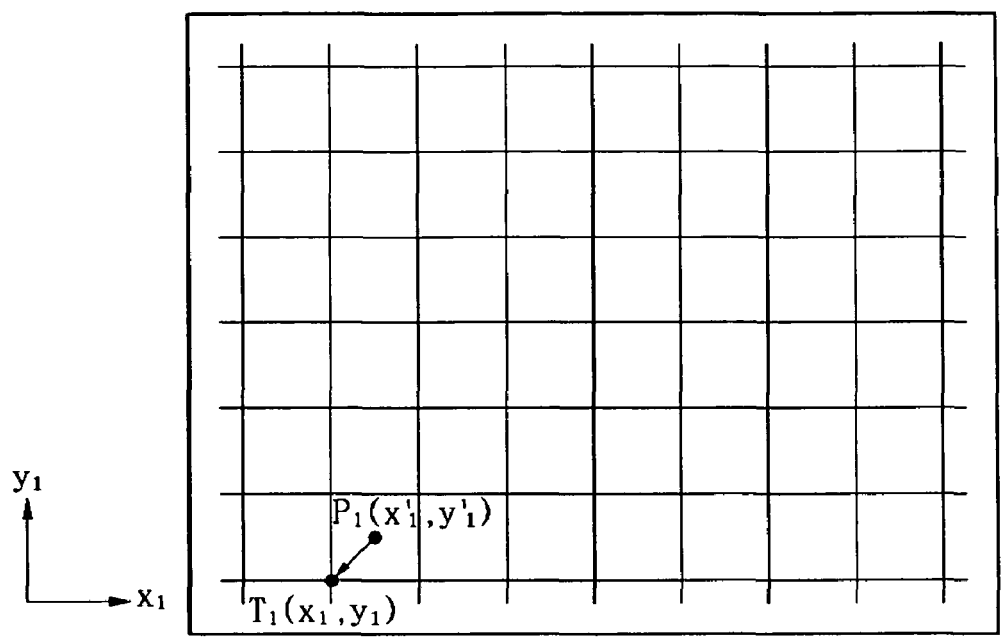
FIGS. 4A and 4B illustrate diagrams for explaining a process of calculating a position error correction amount using a position reference mask according to an exemplary embodiment.
Figure 4B:
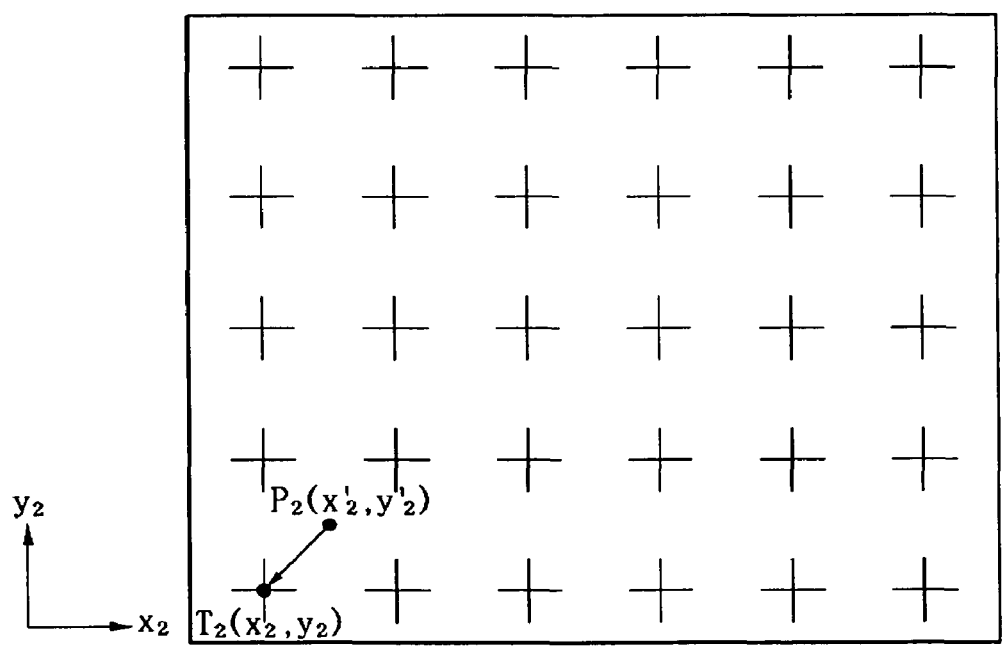

FIGS. 4A and 4B illustrate diagrams for explaining a process of calculating a position error correction amount using a position reference mask according to an exemplary embodiment.

Referring to FIG. 4A, the position reference mask may include a solid-line reference grid. The solid-line reference grid may protrude from the surface of the position reference mask.

A position of the reference grid may be represented by x and y. In this case, a position to which laser light is to be irradiated from the position measurement laser system may be set to $T_1(x_1, y_1)$, and the position of actually-irradiated laser light may be determined as $P_1(x_1', y_1')$. That is, a position error corresponding to a difference between $P_1(x_1', y_1')$ and $T_1(x_1, y_1)$ may occur.

Therefore, the difference between $P_1(x_1', y_1')$, which is the position of the actually-irradiated laser light, and $T_1(x_1, y_1)$, to which laser light is to be irradiated from the position measurement laser system, may correspond to a position error correction amount.

Referring to FIG. 4B, the position reference mask may include a cross-shaped reference grid. The cross-shaped reference grid may protrude from the surface of the position reference mask.

A position of the reference grid may be represented by x and y. In this case, a position to which laser light is to be irradiated from the position measurement laser system may be set to $T_2(x_2, y_2)$, and the position of actually-irradiated laser light may be determined as $P_2(x_2', y_2')$. That is, a position error corresponding to a difference between $P_2(x_2', y_2')$ and $T_2(x_2, y_2)$ may occur.

Therefore, the difference between $P_2(x_2', y_2')$, which is the position of the actually-irradiated laser light, and $T_2(x_2, y_2)$, to which laser light is to be irradiated from the position measurement laser system, may correspond to a position error correction amount.

As described above, the position reference mask and the photomask may simultaneously move for the same distance. Therefore, when a position error occurs on the reference position mask, the same position error may occur on the photomask. Accordingly, it may be possible to calculate a position error correction amount of the photomask by using the position error correction amount of the position reference mask.

Figure 5:
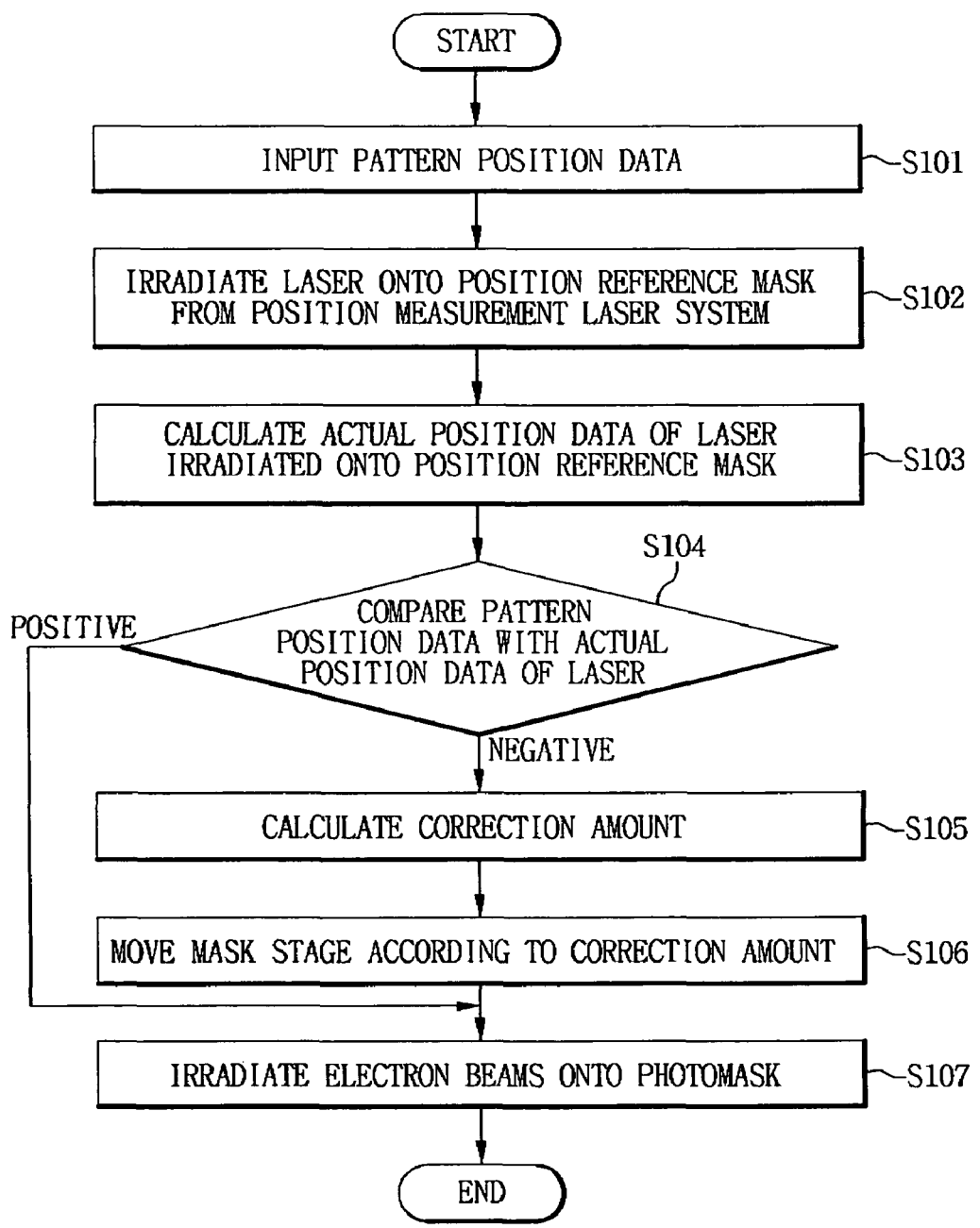
FIG. 5 illustrates a flow chart of a method for correcting a position error of the electron beam lithography apparatus according to an exemplary embodiment.

FIG. 5 illustrates a flow chart of a method for correcting a position error of the electron beam lithography apparatus according to an exemplary embodiment.

Referring to FIG. 5, position data of exposure patterns to be formed on the photomask may be input in operation S101. At this time, as electron beams may be irradiated according to the position data of the exposure pattern to expose the resist disposed on the photomask, resist patterns may be formed. Further, the position data of the exposure pattern may also be applied to the position measurement laser system. In this case, as laser light is periodically irradiated onto the position reference mask according to the position data, a position of the position reference mask may be periodically calculated even during the resist exposure. Therefore, it may be possible to calculate the position of the photomask.

Next, as shown in FIG. 5, in operation S102, the position measurement laser system may irradiate laser light onto the position reference mask. In operation S103, actual position data of the laser light irradiated onto the position reference mask may be calculated.

At this time, laser light may be irradiated onto the position reference mask from the position measurement laser system before the electron beams are irradiated onto the photomask.

That is, before the electron beams are irradiated in order to expose the resist disposed on the photomask such that the resist patterns are formed, the position measurement laser system may irradiate laser light onto the position reference mask to calculate a position error correction amount of the position reference mask. Further, the position error of the photomask having the resist applied thereon may be corrected by using the position error correction amount of the position reference mask. Therefore, the circuit patterns may be accurately formed at predetermined positions on the photomask.

Laser light may be irradiated onto the position reference mask from the position measurement laser system periodically even while the resist is exposed. Therefore, even when a position error occurs during the resist exposure, the position error of the photomask having the resist applied thereon may be corrected in real time by using the position error correction amount of the position reference mask.

At this time, the actual position data of the laser light irradiated onto the position reference mask may be calculated by the following process.

Figure 7A:
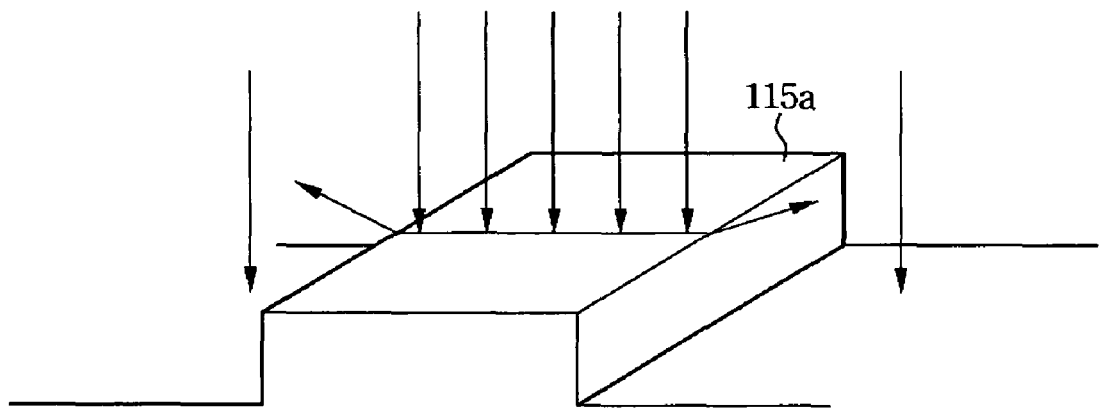
FIG. 7A illustrates a schematic diagram for explaining a process of calculating position data using a profile of received laser light.
Figure 7B:
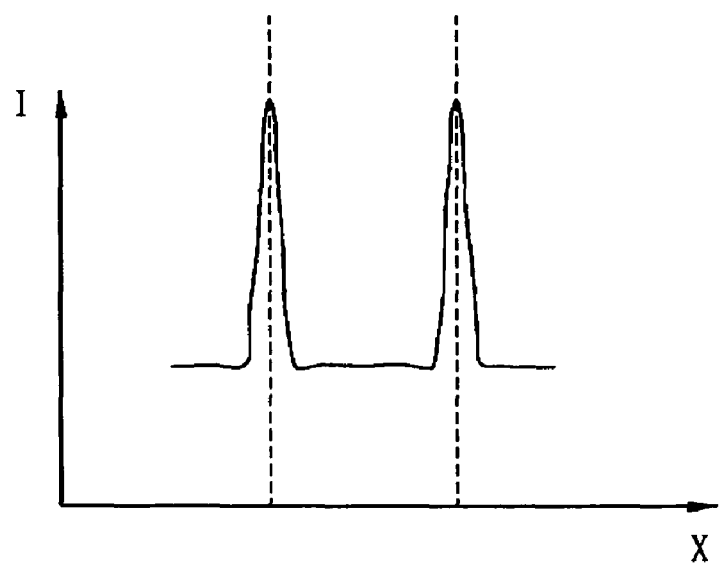
FIG. 7B illustrate the profile obtained by inverting an intensity of laser light reflected from the position reference mask.

FIG. 7A illustrates a schematic diagram for explaining a process of calculating position data using a profile of received laser light. FIG. 7B illustrate the profile obtained by inverting an intensity of laser light reflected from the position reference mask.

Referring to FIG. 7A, when laser light is irradiated onto a position reference mask having a protrusion-shaped reference grid 115a, reflected laser light may be received. The irradiated laser light may not be reflected but scattered at the edges of the protrusion-shaped reference grid 115a. In such a case, an intensity of the laser light received from the edges may be low. Accordingly, it may be possible to obtain a profile as illustrated in FIG. 7B by inverting the intensity of the received laser light.

Specifically, the inverted intensity of laser light may reach the peak at the edges of the reference grid. Such a peak may be analyzed to calculate the actual position data of the laser light. Position measurement methods are well-known techniques. Therefore, the detailed descriptions of the position measurement methods are omitted here.

Returning to FIG. 5, the pattern position data may be compared with the actual position data of laser light in operation S104.

That is, the position data of the exposure pattern input in operation 101 may be compared with the actual position data of the laser light irradiated onto the position reference mask. The actual position data may be calculated in operation S103. Then, it can be judged whether a difference between the data is acceptable or not.

When it is judged through the comparison that the difference between the data is acceptable, that is, the amount of the position error of the position reference mask is smaller, the process may proceed to operation S107. In operation S107, electron beams may be irradiated onto the photomask to expose the resist on the photomask.

On the other hand, when it is judged through the comparison that the difference between the data is unacceptable, that is, the amount of the position error of the position reference mask is larger, the process may proceed to operation 105. In operation 105, a position error correction amount of the position reference mask may be calculated.

At this time, whether the difference between the data is acceptable or unacceptable may be set by an operator who performs the process. The reference value may be properly determined depending on the processes.

As described above, when the difference between the data is acceptable, electron beams may be irradiated onto the photomask to expose the resist on the photomask in operation S107 shown in FIG. 5. Then, the method of correcting a position error of the lithography apparatus may be completed.

However, when the difference between the data is unacceptable, the position error correction amount of the position reference mask may be calculated in operation S105 shown in FIG. 5. The mask stage may be moved according to the calculated correction amount in operation S106 shown in FIG. 5.

For example, as shown in FIG. 4A, when the position to which laser light is to be irradiated from the position measurement laser system, the input pattern position data has been set to $T_1(x_1, y_1)$, but the actual position of the irradiated laser light may be $P_1(x_1', y_1')$. In this case, a position error corresponding to a difference between $P_1(x_1', y_1')$ and $T_1(x_1, y_1)$ may occur. Therefore, a correction amount C may be calculated to be $(x_1'-x_1, y_1'-y_1)$. According to the calculated correction amount, the X-axis mask stage may be moved for as much as $x_1'-x_1$ along the X-axis, and the Y-axis mask stage may be moved for as much as $y_1'-y_1$ along the Y-axis. Thus, the position error of the photomask having the resist applied thereon may be corrected.

Next, electron beams may be irradiated onto the photomask to expose the resist on the photomask in operation S107 shown in FIG. 5. Then, the position error correction method of the lithography apparatus may be completed.

Additionally, the technical idea of the inventive concept may be applied to a wafer processing process for manufacturing semiconductor devices as well as the photomask manufacturing process. When the technical idea is applied to the wafer processing process, the above-described photomask may be a wafer, and the mask stage may be a wafer stage. An exemplary embodiment is described in detail as follows.

Figure 8:
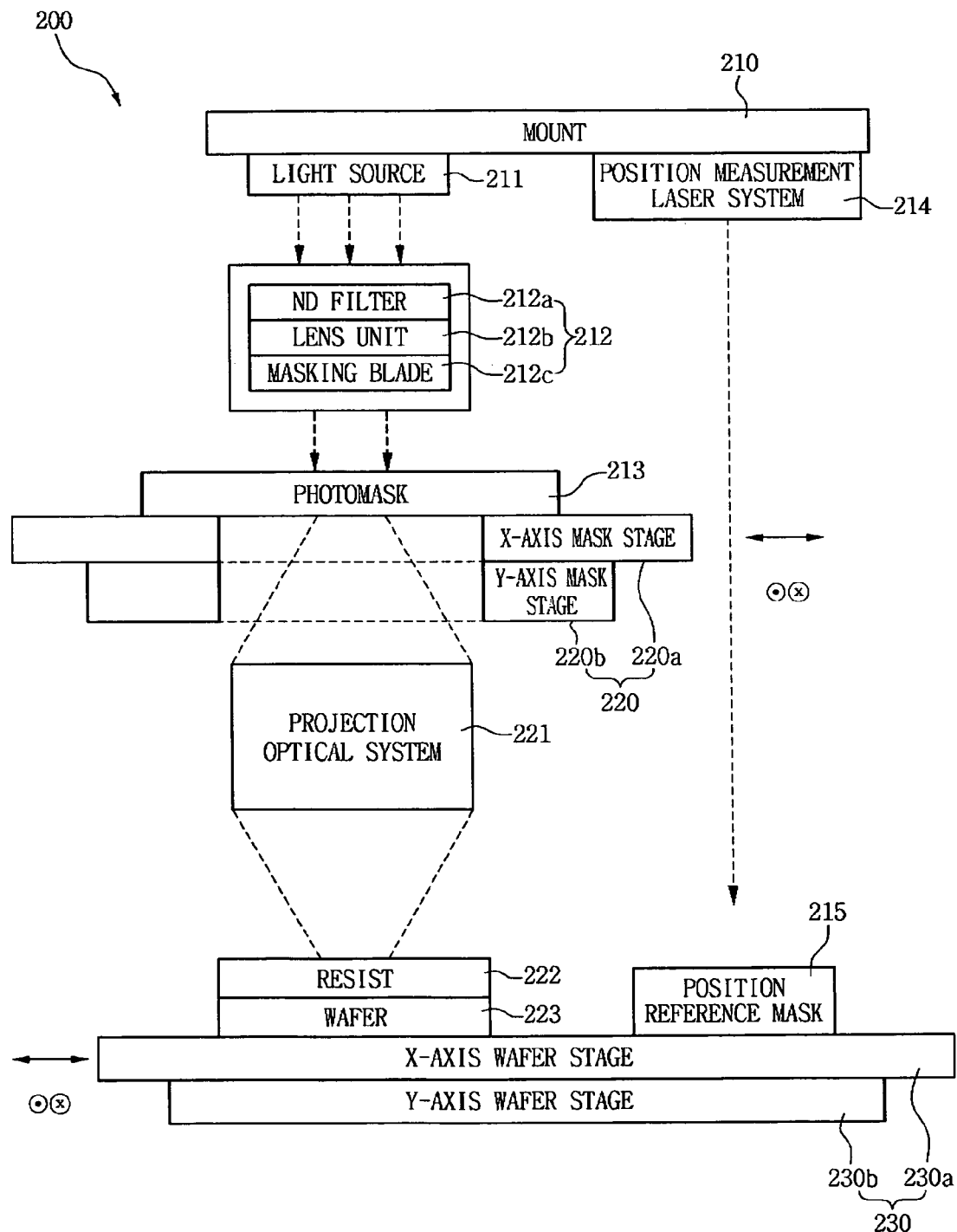
FIG. 8 illustrates a schematic view of a wafer-processing lithography apparatus according to an exemplary embodiment.

FIG. 8 illustrates a schematic view of a wafer-processing lithography apparatus according to an exemplary embodiment.

Referring to FIG. 8, a wafer-processing lithography apparatus 200 may include a light source 211 and an illumination optical system 212 disposed at a position having a predetermined distance from the light source 211. In this case, the light source may be installed on a mount 210.

The light source 211 may irradiate light to the illumination optical system 212. As the light source 211, KrF excimer laser having a wavelength of 248 nm or ArF excimer laser having a wavelength of 193 nm may be used. However, the type of the light source is not limited to those light sources.

The illumination optical system 212 may include a neutral density (ND) filter, a lens unit, a masking blade, and so on. The ND filter 212a may serve to reduce an amount of light incident from the light source 211 to adjust an intensity of the light. The illumination optical system 212 may prevent occurrence of diffraction. The lens unit 212b may be a lens array including an input lens, a condenser lens, a fly eye lens, and so on. The condenser lens may serve to condense light incident to the lens unit 212b to form parallel beams. The fly eye lens may serve to uniformly adjust illumination of light incident to the lens unit 212b. The masking blade 212c may serve to define an irradiation region of the light passing through the illumination optical system 212. The illumination optical system 212 may further include a mirror portion.

A photomask 213 may be disposed at a position having a predetermined distance from the illumination optical system 212. The photomask 213 may include exposure patterns identical to circuit patterns which are to be formed on a wafer 223.

For example, the photomask 213 may include a transparent substrate. Light shielding pattern regions may be arranged on the transparent substrate. The transparent substrate may be made of transparent quartz. On the light shielding pattern regions, exposure patterns to be deposited on the transparent substrate, for example, chrome layer patterns, may be disposed.

That is, the photomask 213 may be formed by the above-described electron-beam lithography apparatus.

The photomask 213 may be positioned on a mask stage 220. The mask stage 220 may comprise an X-axis mask stage 220a and a Y-axis mask stage 220b.

The X-axis mask stage 220a may move the photomask 213 along the X-axis. The Y-axis mask stage 220b may move the photomask 213 along the Y-axis.

A projection optical system 221 may be disposed at a position having a predetermined distance from the photomask 213. The projection optical system 221 may be a reduction projection optical system. The projection optical system 221 may include a lens array.

A wafer stage 230 may be disposed at a position having a predetermined distance from the projection optical system 221. A wafer 223 may be disposed on the wafer stage 230.

The wafer stage 230 may comprise an X-axis wafer stage 230a and a Y-axis wafer stage 230b. The X-axis wafer stage 230a may move the wafer 223 along the X-axis. The Y-axis wafer stage 230b may move the wafer 223 along the Y-axis.

A resist 222 may be applied onto the wafer 223. The resist 222 may be a component for forming circuit patterns on the wafer 223. Since this is obvious to those skilled in the art, detailed description of the resist 222 is omitted here.

Continuously, referring to FIG. 8, the wafer-processing lithography apparatus 200 according to the exemplary embodiment is described as follows.

The wafer-processing lithography apparatus 200 may include a position measurement laser system 214 and a position reference mask 215. The position measurement laser system 214 may be installed on a mount 210 on which the light source is installed. The position reference mask 215 may be disposed at a position having a predetermined distance from the position measurement laser system 214. The position reference mask 215 may be disposed on the wafer stage 230 on which the wafer 223 is disposed.

The position measurement laser system 214 may irradiate laser light onto the position reference mask 215 to calculate the position of the irradiated laser light. The position reference mask 215 may have a reference grid formed thereon to compare the actual position of laser light irradiated from the position measurement laser system 214 with the pattern position data.

As described above, the position reference mask 215 may be disposed on the wafer stage 230 on which the wafer 223 is disposed. Therefore, when the wafer 223 having the resist 222 applied thereon moves, the position reference mask 215 may move for the same distance as the wafer 223 having the resist 222 applied thereon.

That is, the position reference mask 215 and the wafer 223 having the resist 222 applied thereon may move for the same distance simultaneously. Therefore, the position of the wafer 223 having the resist 222 applied thereon may also be calculated by calculating the position of the position reference mask 215.

Further, when a position error occurs on the position reference mask 215, the same position error may occur on the wafer 223 having the resist 222 applied thereon. Therefore, it may be possible to calculate the position error of the wafer 223 having the resist 222 applied thereon. In particular, as the position of the position reference mask 215 is periodically calculated even during the resist exposure, the position error of the wafer 223 may be calculated in real time.

A position error correction amount using the position reference mask may be calculated in the same manner as in the electron-beam lithography apparatus. Therefore, the description of the calculation is omitted here.

Figure 9:
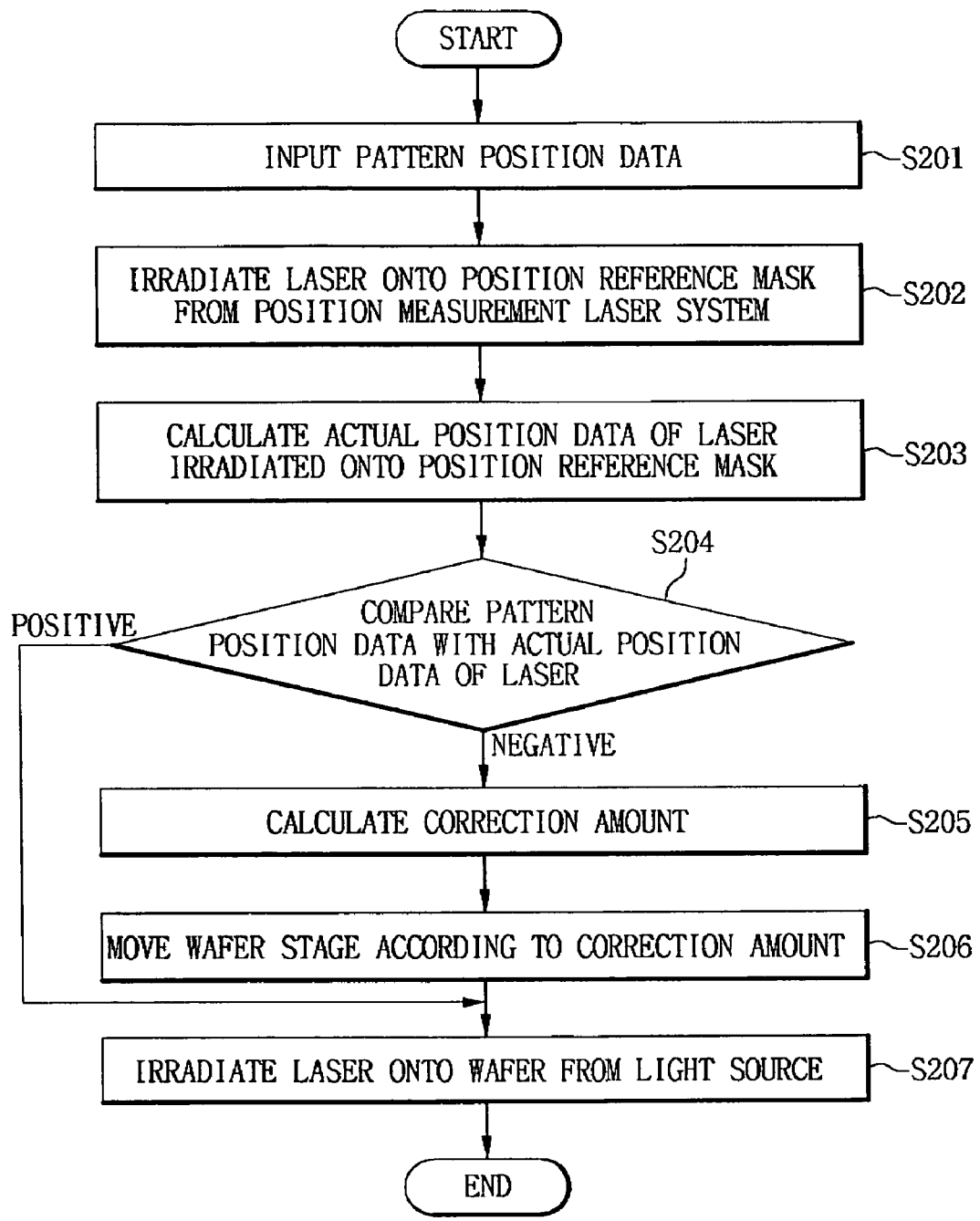
FIG. 9 illustrates a flow chart of a method for correcting a position error of the wafer-processing lithography apparatus according to an exemplary embodiment.

FIG. 9 is a flow chart of a method for correcting a position error of the wafer-processing lithography apparatus according to an exemplary embodiment.

Referring to FIG. 9, a position data of exposure patterns of a photomask may be input in operation S201. The exposure patterns are identical to circuit patters to be formed on the above-described wafer. At this time, according to the position data of the exposure pattern, the light source may irradiate laser light to expose the resist disposed on the wafer so as to form resist patterns. Further, the position data of the exposure pattern may be applied to the position measurement laser system. In this case, as laser light is periodically irradiated onto the position reference mask according to the position data, the position of the position reference mask may be periodically calculated even during the resist exposure. Accordingly, it may be possible to calculate the position of the wafer having the resist applied thereon.

Next, the position measurement laser system may irradiate laser light onto the position reference mask in operation S202 shown in FIG. 9. Actual position data of the laser light irradiated onto the position reference mask may be calculated in operation S203.

At this time, laser light onto the position reference mask from the position measurement laser system may be irradiated before the light source irradiates laser light.

That is, before the light source irradiates laser light in order to expose the resist on the wafer so as to form the resist patterns, the position measurement laser system may irradiate laser light onto the position reference mask to calculate a position error correction amount of the position reference mask. Then, the position error of the wafer having the resist applied thereon may be corrected using the position error correction amount of the position reference mask. Therefore, the circuit patterns defined on the photomask may be accurately formed at predetermined positions on the wafer.

Further, laser light onto the position reference mask from the position measurement laser system may be periodically irradiated even while the resist is exposed. Therefore, when a position error occurs during the resist exposure, the position error of the wafer having the resist applied thereon may be corrected in real time by using the position error correction amount of the position reference mask.

The actual position data of the laser light irradiated onto the position reference mask may be calculated in the same manner as in the electron-beam lithography apparatus. Therefore, description of the calculation is omitted here.

Next, the pattern position data may be compared with the actual position data of the laser light in operation S204 shown in FIG. 9.

That is, the exposure pattern position data input in operation S201 may be compared with the actual position data of the laser light irradiated onto the position reference mask. The actual position data is calculated in operation S203. Then, it may be judged whether a difference between the data is acceptable or not.

When it is judged from the comparison that the difference between the data is acceptable, that is, when the amount of position error of the position reference mask is smaller, the process may proceed to operation S207 shown in FIG. 9. In operation S207, the light source irradiates laser light onto the wafer such that the circuit patterns defined on the photomask are formed at predetermined positions of the wafer.

Further, when it is judged from the comparison that the difference between the data is unacceptable, that is, when the amount of position error of the position reference mask is larger, the process may proceed to operation S205 shown in FIG. 9. In operation S205, a position error correction amount of the position reference mask is calculated.

At this time, whether the difference between the data is acceptable or unacceptable may be set by an operator who performs the process. The reference value may be properly determined depending on processes.

As described above, when the difference between the data is acceptable, the light source may irradiate laser light onto the wafer in operation S207 shown in FIG. 9 so as to form the circuit patterns defined on the photomask at predetermined positions on the wafer. Then, the method for correcting a position error of the wafer-processing lithography apparatus may be completed.

However, when the difference between the data is unacceptable, a position error correction amount of the position reference mask may be calculated in operation S205 shown in FIG. 9. The wafer stage may be moved according to the calculated correction amount in operation S206 shown in FIG. 9.

The wafer stage may be moved according to the calculated correction amount in the same manner as in the electron-beam lithography apparatus according to the exemplary embodiment. Therefore, description of movement of the wafer stage is omitted here.

Next, the light source may irradiate laser light onto the wafer in operation S207 shown in FIG. 9 so as to form the circuit patterns defined on the photomask at predetermined positions on the wafer. Then, the method for correcting a position error of the wafer-processing lithography apparatus may be completed.

When the circuit patterns of the photomask are formed by the lithography apparatus, the position reference mask may be disposed on the mask stage on which the photomask is disposed. Therefore, the circuit patterns may be accurately formed at predetermined positions on the photomask. Further, as the position error correction amount of the position reference mask is periodically calculated, it may be possible to correct the position error of the photomask having the resist applied thereon in real time.

Further, when the circuit patterns of the photomask are transferred onto the wafer by the lithography apparatus, the position reference mask may be disposed on the wafer stage on which the wafer is disposed. Therefore, the circuit patterns defined on the photomask may be accurately formed at predetermined positions on the wafer. Further, as the position error correction amount of the position reference mask is periodically calculated, it may be possible to correct the position error of the wafer having the resist applied thereon in real time.

The foregoing is illustrative of exemplary embodiments and is not to be construed as limiting thereof. Although several exemplary embodiments have been described, those skilled in the art will readily appreciate that many modifications are possible in the exemplary embodiments without materially departing from the novel teachings and advantages. Accordingly, all such modifications are intended to be included within the scope of the invention as defined in the claims. In the claims, means-plus-function clauses, if any, are intended to cover not only the structures described herein as performing the recited function, but also structural equivalents. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:

1. A method for correcting a position error of a lithography apparatus, comprising:
    inputting position data of an exposure pattern;
    irradiating laser light onto a position reference mask from a position measurement laser system;
    calculating actual position data of the laser light irradiated onto the position reference mask;
    comparing the position data of the exposure pattern with the actual position data of the laser light irradiated onto the position reference mask; and
    adjusting a position of a stage supporting a substrate in accordance with the comparison, the position reference mask and substrate being supported by the same stage.

2. The method as claimed in claim 1, further comprising calculating a position error correction amount of the position reference mask based on a result of the comparison when it is judged that a difference between the position data of the exposure pattern and the actual position data of the laser light is larger than a reference value.

3. The method as claimed in claim 2, further comprising moving the stage according to the calculated position error correction amount of the position reference mask, a position error correction amount of the substrate being equal to the position error correction amount of the position reference mask.

4. The method as claimed in claim 3, wherein irradiating the laser light onto the position reference mask is periodically performed while a resist disposed on the substrate is exposed, the position data of the exposure pattern and the actual position data of the laser light irradiated onto the position reference mask are compared and the position error correction amount of the position reference mask is calculated, and a position error of the stage is corrected in real time according to the calculated position error correction amount.

5. The method as claimed in claim 3, further comprising irradiating electron beams onto the substrate after moving the stage, the substrate being a photomask.

6. The method as claimed in claim 1, wherein adjusting the position of the stage includes moving the stage, such that the substrate and position reference mask are moved simultaneously in a same direction to a same distance.

7. The method as claimed in claim 1, wherein:
inputting position data of the exposure pattern includes inputting desired coordinates of a location to be irradiated on the position reference mask;
calculating the actual position data of the laser light includes determining coordinates of a location where the laser light is incident on the position reference mask; and
adjusting the position of the stage includes adjusting position of the substrate in real-time during exposure operation, the substrate being a wafer or a photomask to be patterned.

8. The method as claimed in claim 1, wherein adjusting the position of the stage includes no stage movement, if a difference between the position data of the exposure pattern and the actual position data of the laser light is smaller than a reference value.

9. The method as claimed in claim 1, wherein irradiating the laser light, calculating the actual position data, and comparing the data are performed periodically, such that position of the substrate may be adjusted periodically during exposure of the substrate.

10. The method as claimed in claim 1, wherein the position reference mask and the substrate are positioned directly on the same stage, such that centers of the position reference mask and substrate are spaced apart from each other along a horizontal direction parallel to the stage.

11. The method as claimed in claim 1, wherein comparing the position data of the exposure pattern with the actual position data of the laser light includes determining position inaccuracy of the stage supporting both the position reference mask and the substrate.

12. A method for correcting a position error of a lithography apparatus, comprising:
inputting a position data $T_1(x_1, y_1)$ of an exposure pattern;
irradiating laser light onto a position reference mask installed on a stage from a position measurement laser system installed on a mount;
calculating an actual position data $P_1(x_1', y_1')$ of the laser light irradiated onto the position reference mask;
comparing the position data $T1(x1, y1)$ with the actual position data $P1(x1', y1')$;
judging through the comparison whether a difference between the data is acceptable or not;
calculating a position error correction amount of the position reference mask based on a result of the comparison when it is judged that the difference between the data is unacceptable;
using the position error correction amount of the position reference mask to determine a position error correction mount of a substrate, the position error correction amounts of the position reference mask and substrate being substantially the same;
moving the stage according to the calculated position error correction amount of the substrate, the substrate being positioned on the same stage as the position reference mask; and
exposing the substrate.

13. The method as claimed in claim 12, further comprising irradiating laser light onto the substrate installed on the stage from a light source installed on the mount after moving the stage, the substrate being a wafer.

14. The method as claimed in claim 12, further comprising irradiating laser light onto the substrate installed on the stage from a light source installed on the mount after moving the stage, the substrate being a photomask.

15. The method as claimed in claim 12, wherein irradiating the laser light onto the position reference mask and exposing the substrate use different light sources.

\* \* \* \* \*